United States Patent
Lu et al.

(10) Patent No.: US 7,253,124 B2
(45) Date of Patent: Aug. 7, 2007

(54) PROCESS FOR DEFECT REDUCTION IN ELECTROCHEMICAL PLATING

(75) Inventors: Jiong-Ping Lu, Richardson, TX (US); Patricia B. Smith, Colleyville, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/971,210

(22) Filed: Oct. 4, 2001

(65) Prior Publication Data

US 2002/0076929 A1 Jun. 20, 2002

Related U.S. Application Data

(60) Provisional application No. 60/242,157, filed on Oct. 20, 2000.

(51) Int. Cl.
*H01L 21/26* (2006.01)

(52) U.S. Cl. ............................................. 438/795

(58) Field of Classification Search ........ 438/677–687, 438/653, 643, 695, 710–712, 725, 795–799, 438/660–663
See application file for complete search history.

(56) References Cited

U.S. PATENT DOCUMENTS

| | | | | |
|---|---|---|---|---|
| 5,403,436 A | * | 4/1995 | Fujimura et al. | 156/643 |
| 5,753,886 A | * | 5/1998 | Iwamura et al. | 219/121.43 |
| 6,001,736 A | * | 12/1999 | Kondo et al. | 438/677 |
| 6,284,649 B1 | * | 9/2001 | Miyamoto | 438/643 |
| 6,319,728 B1 | * | 11/2001 | Bhan et al. | 438/687 |
| 6,355,106 B1 | * | 3/2002 | Zheng et al. | 118/697 |
| 6,395,642 B1 | * | 5/2002 | Liu et al. | 438/720 |
| 6,743,473 B1 | * | 6/2004 | Parkhe et al. | 427/252 |
| 2002/0072227 A1 | * | 6/2002 | Russell et al. | 438/653 |
| 2004/0023452 A1 | * | 2/2004 | Wang et al. | 438/202 |

* cited by examiner

*Primary Examiner*—Calvin Lee
(74) *Attorney, Agent, or Firm*—Jacqueline J. Garner; W. James Bardy, III; Frederick J Telecky, Jr.

(57) ABSTRACT

A pre-ECD surface treatment. After forming the barrier material (110) and seed layer (112), the surface of the seed layer (112) is treated with an $H_2$ plasma to remove surface contamination (122), reduce any $CuO_x$ (123), and improve wettability. The ECD copper film (124) is then formed over the seed layer (112).

9 Claims, 1 Drawing Sheet

PROCESS FOR DEFECT REDUCTION IN ELECTROCHEMICAL PLATING

This application claims priority under 35 USC§119(e)(1) of provisional application No. 60/242,157 filed Oct. 20, 2000.

FIELD OF THE INVENTION

The invention is generally related to the field of fabricating copper interconnects in semiconductor devices and more specifically to a defect reduction in electrochemical copper plating.

BACKGROUND OF THE INVENTION

As the density of semiconductor devices increases, the demands on interconnect layers for connecting the semiconductor devices to each other also increases. Therefore, there is a desire to switch from the traditional aluminum metal interconnects to copper interconnects. Unfortunately, suitable copper etches for a semiconductor fabrication environment are not readily available. To overcome the copper etch problem, damascene processes have been developed.

In a conventional interconnect process, the aluminum (and any barrier metals) are deposited, patterned, and etched to form the interconnect lines. Then, an interlevel dielectric (ILD) is deposited and planarized. In a damascene process, the ILD is formed first. The ILD is then patterned and etched. The barrier material is then deposited over the structure with the copper being formed over the barrier material. Then, the copper and barrier material are chemically-mechanically polished to remove the conducting material from over the ILD, leaving metal interconnect lines. A metal etch is thereby avoided.

The most practical technique for forming copper interconnects is electrochemical deposition (ECD). In this process, after the barrier material is deposited, a seed layer of copper is deposited. Then, ECD is used to deposit copper over the seed layer. ECD is a process used to produce a solid phase product (such as a thin film) by electrochemical reaction. Cu ECD is a process used to make Cu thin films through the electrochemical reduction of Cu ions, represented by the following chemical equation:

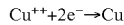

$$Cu^{++} + 2e^- \rightarrow Cu$$

where $e^-$ represents electron.

In order for the ECD process to proceed, a seed layer is required to pass current and to serve as a nucleation layer. The wettability of the seed surface is very critical for the success of the ECD process. If the plating solution cannot wet the seed surface, no Cu can by deposited on that area of the surface, forming a void.

One of the problems with ECD copper films is that the films frequently show unacceptably high defect levels. The defect concentration is very sensitive to the surface condition. For example, examining wafers prior to ECD by scanning electron microscopy (SEM) can increase the ECD defect concentration due to surface contamination. The surface effect can be traced to wettability of the seed surface with the bath solution. A method for improving the wettability of the seed surface is therefore desired.

SUMMARY OF THE INVENTION

The invention is a pre-ECD plasma strip/passivation treatment. After forming the barrier layer and the seed layer, the surface of the seed layer is treated with a plasma to strip the surface contamination, chemically reduce any surface copper-oxides, and passivate the surface of the seed layer. The ECD copper film is then formed over the treated seed layer.

An advantage of the invention is providing a stable manufacturing process for ECD of copper films.

This and other advantages will be apparent to those of ordinary skill in the art having reference to the specification in conjunction with the drawings.

DETAILED DESCRIPTION OF THE EMBODIMENTS

The invention will now be discussed in conjunction with a via-first dual damascene copper interconnect process. It will be apparent to those of ordinary skill in the art that the benefits of the invention apply generally to ECD of copper in the semiconductor fabrication environment.

Figure 1A:
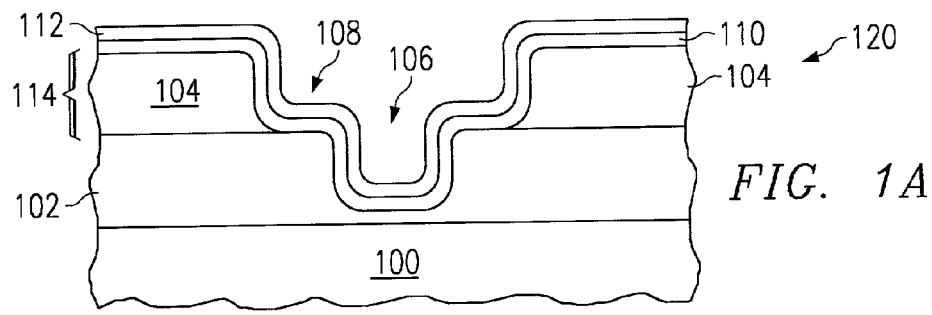
FIGS. 1A-1C are cross-sectional drawings of a copper interconnect structure formed according to the invention.
Figure 1B:
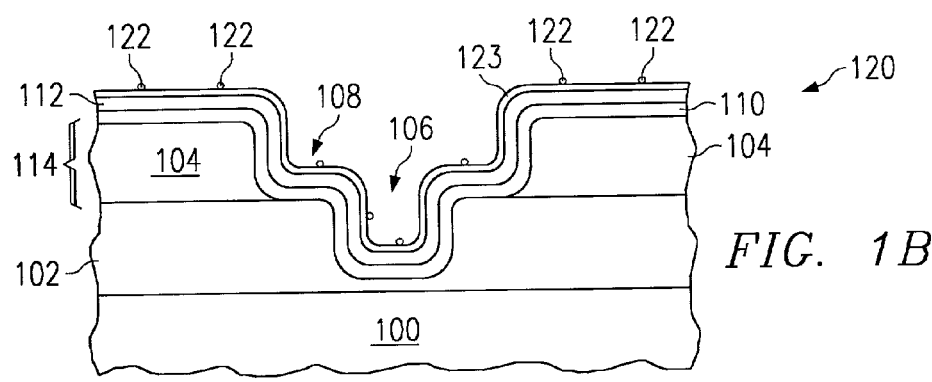

Embodiments of the invention will now be discussed with reference to FIGS. 1A-1C. A semiconductor body 100 is processed through formation of the seed layer 112. Semiconductor body 100 typically comprises a silicon substrate having transistors and other elements formed therein. Seed layer 112 is part of a copper interconnect level 114. Copper interconnect level 114 may be the first or any subsequent metal interconnect level of the semiconductor device 120.

An ILD 102 is formed over semiconductor body 100. IMD (intrametal dielectric) 104 is formed over ILD 102. An etchetop layer (not shown) may optionally be placed between ILD 102 and IMD 104. Suitable dielectrics for ILD 102 and IMD 104, such as silicon dioxides, fluorine-doped silicate glass (FSG), organo-silicate glass (OSG), hydrogen silesquioxane (HSQ), and combinations thereof, are known in the art.

A via 106 is etched in ILD 102 and a trench 108 is etched in IMD 104. Via 106 is used to connect to underlying metal interconnect layers. Trench 108 is used to form the metal interconnect layer.

Barrier layer 110 is deposited over IMD 104 including in trench 108 and via 106. Barrier layer 110 functions to prevent copper diffusion into the ILD and IMD layers. Suitable barrier materials such as Ta/TaN are known in the art. Seed layer 112 is deposited over barrier layer 110.

The time between the formation of the seed layer 112 and the copper ECD layer can vary for a variety of reasons. Typically, wafers are stored in a cassette after the formation of the seed layer 112. As time passes, the surface conditions of the seed layer 112 degrade as organic contaminants 122 from the ambient environment deposit on the surface and the copper surface reacts with oxygen to form $CuO_x$ ($Cu_2O$ and $CuO$) 123. The result is shown in FIG. 1B.

In order to remove the surface contaminants 122, reduce any $CuO_x$ 123 and improve the wetting characteristics of the seed surface, a plasma treatment (e.g., $H_2$ plasma) is performed on the surface of seed layer 116 prior to copper ECD.

As an example, the following process recipe may be used in a downstream isotropic etch tool such as a tool using an inductively coupled plasma chamber (selective mode):

| | |
|---|---|
| Platen temp.: | 60° C. |
| RF power: | 700 W at 13.6 MHz |
| $H_2$ flow: | 1200 sccm |
| $N_2$ flow: | 800 sccm |
| Pressure: | 2.0 Torr |
| Duration: | 2 minutes. |

Other downstream plasma tools employing other frequency plasma generation, such as microwave frequency (2.45 GHz) may alternatively be used. Downstream etch tools provide a completely chemical etch. Alternatively, a reactive ion etching (RIE) tool could be used. RIE adds a physical component to the etch. Also combinations of downstream plus an additional plasma source for providing a physical etch can be used.

An important aspect of the invention is the presence of hydrogen. A gas chemistry is selected that can liberate or provide hydrogen radicals. Exemplary gas chemistries include $NH_3$, $CH_4$, $C_2H_6$, and $H_2$ with an inert gas such as $N_2$, Ar, Xe, or He.

The H-plasma treatment removes both sources of defects: the airborne (organic) molecular contaminants and $CuO_x$. The $H_2$ plasma strips the airborne molecular contaminants from the surface. $CuO_x$ is converted to metallic copper during the $H_2$ plasma process. Because it removes both sources of defects, substantial defect reduction in the ECD Cu can be obtained using this process. Moreover, the defects that remain tend to be less significant and not killer defects.

Figure 1C:
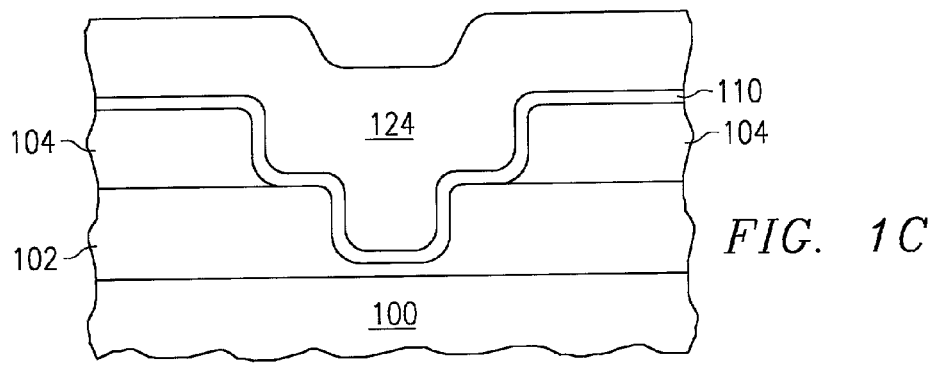

After pre-treatment, copper ECD is performed as shown in FIG. 1C to form copper layer 124. Various copper ECD processes are known in the art. In one example, a 3-step process is used. After placing the wafer in the plating solution, a current of approximately 0.75 Amps is passed through the seed layer 112 for a time on the order of 15 secs. The current is then increased to around 3 Amps for approximately 60 seconds. Final plating occurs at a current of about 7.5 Amps with the duration determined by the final desired thickness. A quick spin-rinse dry (SRD) is performed in the plating cell above the plating solution. The wafer is then transferred to the SRD cell and a post-ECD SRD is used to clean the plating residue from the wafer surface.

After copper ECD, the copper 124 and barrier 110 are chemically mechanically polished (CMP) to remove the material from above IMD 104. Processing may then continue to form additional metal interconnect levels and package the device.

Table 1 shows the results of a preliminary test comparing $H_2$ plasma (strip-passivation) treated blanket copper seed wafers and untreated (control) blanket copper seed wafers. Defect counts were measured after Cu ECD. Significant reduction in the number of defects occurred in the strip-passivation treated wafers.

TABLE 1

| Sample | # of Defects (per unit area) by SP1 measurement |
|---|---|
| Strip-passivation treated wafer 1 | 94 |
| Control wafer 1 | 217 |

TABLE 1-continued

| Sample | # of Defects (per unit area) by SP1 measurement |
|---|---|
| Strip-passivation treated wafer 2 | 69 |
| Control wafer 2 | 406 |

Figure 2:
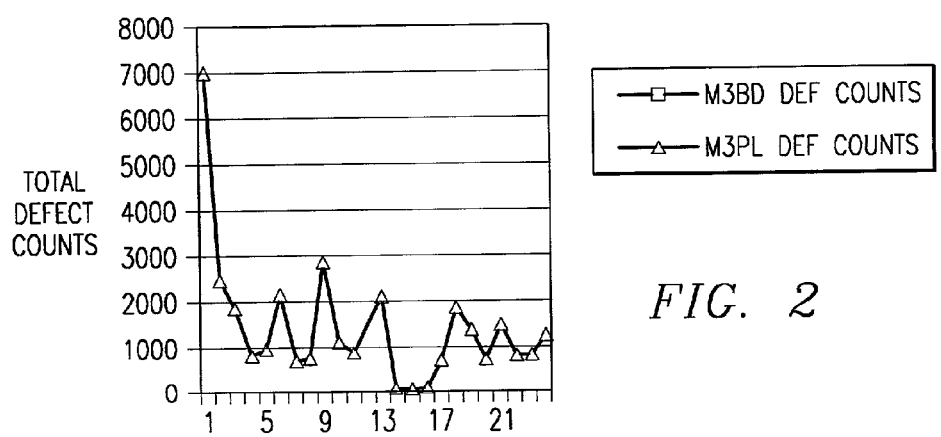
FIG. 2 is a graph of defect counts at post-metal-3 ECD and CMP.

FIG. 2 is a graph of defect counts for 24 patterned wafers of a lot. Table 2 (below) shows the defect counts in tabular form. Wafers 14, 15, and 16 were subjected to a $H_2$ plasma pre-treatment of the seed layer prior to copper ECD of the third metal interconnect layer (M3). In the graph, M3ECD refers to the defect count after M3 has been planarized. M3BD represents the defect count after barrier/seed deposition but prior to ECD copper deposition. The defect count for the $H_2$ plasma treated wafers is significantly reduced (~10x or more) versus the non-treated wafers.

TABLE 2

| Wafer ID | M3BD | M3ECD | Plasma pre-treat |
|---|---|---|---|
| 1 | | 6923 | none |
| 2 | | 2520 | none |
| 3 | 715 | 1877 | none |
| 4 | 742 | 820 | none |
| 5 | | 1008 | none |
| 6 | | 2123 | none |
| 7 | | 749 | none |
| 8 | | 778 | none |
| 9 | | 2732 | none |
| 10 | | 1123 | none |
| 11 | | 845 | none |
| 12 | | 1526 | none |
| 13 | 695 | 2043 | none |
| 14 | 511 | 76 | $H_2$ |
| 15 | 185 | 68 | $H_2$ |
| 16 | 379 | 78 | $H_2$ |
| 17 | | 673 | none |
| 18 | | 1821 | none |
| 19 | | 1395 | none |
| 20 | | 667 | none |
| 21 | | 1376 | none |
| 22 | | 777 | none |
| 23 | | 778 | none |
| 24 | | 1202 | none |

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A method of fabricating an integrated circuit, comprising the steps of:
    forming a copper seed layer over a semiconductor body;
    performing a downstream isotropic plasma treatment using a hydrogen-containing chemistry on said copper seed layer; and
    after performing said plasma treatment, depositing a copper layer on said copper seed layer using electrochemical deposition (ECD).

2. The method of claim 1, wherein said step of performing a plasma treatment occurs in a downstream plasma etch tool.

3. The method of claim 1, wherein said hydrogen-containing chemistry comprises $H_2$.

4. The method of claim 3, wherein said hydrogen-containing chemistry further comprises an inert gas selected from the group consisting of $N_2$, Ar, Xe, He, and Ne.

5. The method of claim 1, wherein said hydrogen-containing chemistry is selected from the group consisting of $NH_3$, $CH_4$, and $C_2H_6$.

6. A method of fabricating a copper interconnect for an integrated circuit comprising the steps of:
 providing a semiconductor body having a dielectric layer with a trench formed therein;
 forming a barrier layer over said dielectric layer including within said trench;
 forming a copper seed layer over said barrier layer;
 treating said copper seed layer with hydrogen plasma in a downstream isotropic plasma etch tool to remove any organic contaminants from a surface of said copper seed layer;
 after said treating step, electrochemically depositing a copper layer on said copper seed layer; and
 chemically-mechanically polishing said copper layer to form said copper interconnect in said trench.

7. The method of claim 6, wherein said hydrogen-containing chemistry comprises $H_2$.

8. The method of claim 7, wherein said hydrogen-containing chemistry further comprises an inert gas selected from the group consisting of $N_2$, Ar, Xe. He and Ne.

9. The method of claim 6, wherein said hydrogen-containing chemistry is selected from the group consisting of $NH_3$, $CH_4$, and $C_2H_6$.

* * * * *